United States Patent
Takeuchi et al.

(10) Patent No.: US 8,153,900 B2
(45) Date of Patent: Apr. 10, 2012

(54) WIRING SUBSTRATE WITH LEAD PIN AND LEAD PIN

(75) Inventors: Hirokazu Takeuchi, Nagano (JP); Kiyotaka Shimada, Nagano (JP); Masayoshi Ebe, Nagano (JP); Yoshinori Furihata, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 753 days.

(21) Appl. No.: 12/200,201

(22) Filed: Aug. 28, 2008

(65) Prior Publication Data

US 2009/0056992 A1  Mar. 5, 2009

(30) Foreign Application Priority Data

Aug. 30, 2007  (JP) .................................. 2007-223812
May 20, 2008  (JP) .................................. 2008-131912

(51) Int. Cl.
*H01B 5/00* (2006.01)

(52) U.S. Cl. .................... 174/126.1; 174/260; 174/267; 361/707; 361/710; 361/712; 439/83; 439/876

(58) Field of Classification Search .......... 361/704–710, 361/712, 717–722; 174/15.1, 16.3, 126.1, 174/357, 260, 263, 265, 267
See application file for complete search history.

(56) References Cited

U.S. PATENT DOCUMENTS

| | | | | |
|---|---|---|---|---|
| 6,011,222 A | * | 1/2000 | Sekiya et al. | 174/266 |
| 6,270,362 B1 | * | 8/2001 | Guran et al. | 439/83 |
| 7,485,017 B2 | * | 2/2009 | Pang et al. | 439/876 |
| 2001/0015491 A1 | * | 8/2001 | Shiraishi | 257/697 |
| 2002/0117330 A1 | * | 8/2002 | Eldridge et al. | 174/260 |
| 2008/0009155 A1 | * | 1/2008 | Ide et al. | 439/83 |
| 2011/0067899 A1 | * | 3/2011 | Choi et al. | 174/126.1 |

FOREIGN PATENT DOCUMENTS

| | | |
|---|---|---|
| JP | 63-104460 A | 5/1988 |
| JP | 2001-217341 | 8/2001 |
| JP | 2001-358277 | 12/2001 |
| JP | 2002-289761 A | 10/2002 |
| JP | 2003-17611 A | 1/2003 |
| JP | 2006-086283 | 3/2006 |

\* cited by examiner

*Primary Examiner* — Courtney Smith
(74) *Attorney, Agent, or Firm* — Rankin, Hill & Clark LLP (57) ABSTRACT

A wiring substrate with a lead pin is formed by bonding lead pins to electrode pads formed on a wiring substrate through conductive materials. In the lead pin, a conic protrusion part whose side surface is formed in a concave surface is formed in the end face side opposed to the electrode pad of a head part formed in one end of a shaft part. The lead pin is bonded to the electrode pad in a state in which the conductive material extends to the back surface side of a head part beyond a flange part of the head part and reaches the shaft part of the lead pin.

10 Claims, 9 Drawing Sheets

WIRING SUBSTRATE WITH LEAD PIN AND LEAD PIN

TECHNICAL FIELD

The present disclosure relates to a wiring substrate with a lead pin and a lead pin, and more particularly to a pin grid array (PGA) type wiring substrate with lead pins formed by bonding lead pins to electrode pads, and lead pins used in this wiring substrate.

RELATED ART

Figure 9A:
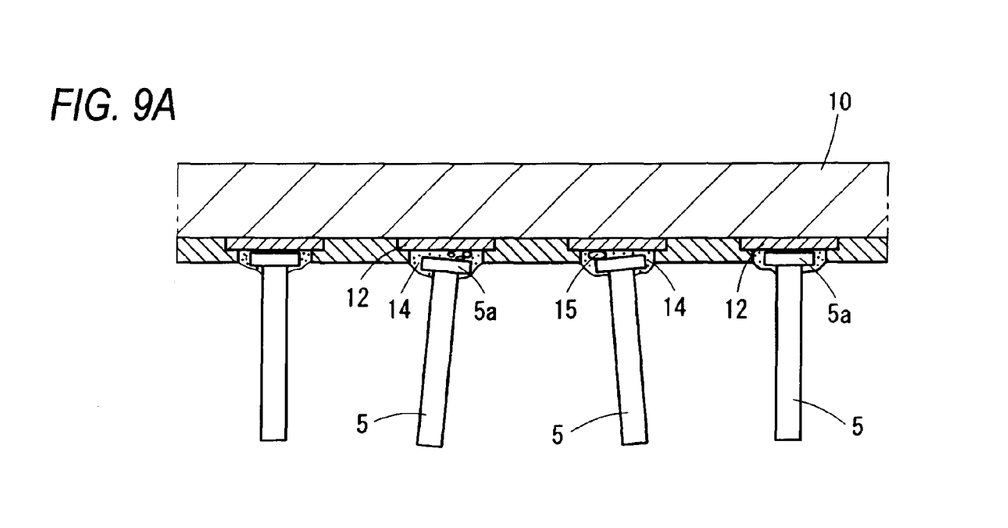
FIGS. 9A and 9B are sectional views showing a related-art configuration of a wiring substrate with lead pins.
Figure 9B:
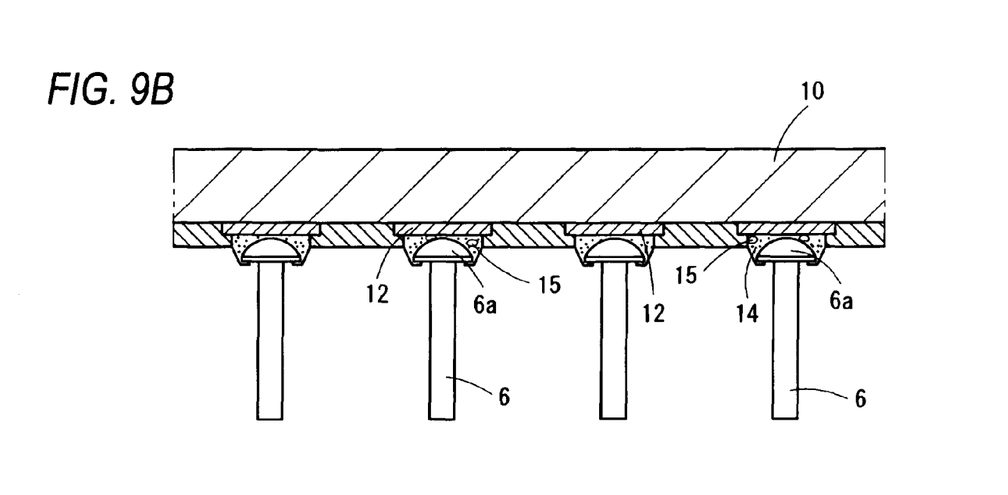

A pin grid array type wiring substrate with lead pins includes a product provided by bonding lead pins 5, 6 to electrode pads 12 disposed in a wiring substrate 10 through conductive materials 14 such as solder as shown in FIGS. 9A and 9B. FIG. 9A is an example in which the lead pin 5 of the so-called flat pin type whose head part 5a is formed in a flat disk shape is bonded to the electrode pad 12 with the head part 5a abutted on the electrode pad 12. FIG. 9B is an example formed by bonding the lead pin 6 comprising a head part 6a in which the surface side of bonding to the electrode pad 12 is formed in a spherical surface to the electrode pad 12.

In the case of bonding the lead pins 5, 6 to the wiring substrate 10, the conductive material 14 such as solder is supplied to the electrode pad 12 and by a support jig, the lead pin is supported and the lead pin is aligned with the electrode pad 12 and the wiring substrate 10 is bonded by passing through a reflow apparatus together with the support jig. The lead pin used in the recent wiring substrate with lead pins has extremely thin diameters in which an outside diameter of a shaft part of the pin is 0.3 mm and an outside diameter of the head part is 0.6 to 0.7 mm and the lead pins are arranged at a narrow distance, so that a strength of bonding of the lead pin to the electrode pad and misalignment due to inclination etc. of the lead pin in a state of bonding the lead pin to the electrode pad become problems.

FIG. 9A shows a state in which a void 15 occurs in the conductive material 14 with which a gap between the electrode pad 12 and the head part 5a of the lead pin 5 is filled and the lead pin 5 is connected with the lead pin 5 inclined from an erect position. When the lead pin 5 is bonded with the lead pin 5 inclined thus, problems that the support jig cannot be removed from the wiring substrate after reflow or the lead pin 5 is deformed in the case of removing the support jig, or problems that a height of the tip of the lead pin 5 varies or reliability of electrical connection between the lead pin 5 and the electrode pad 12 is decreased arise.

The lead pin 6 shown in FIG. 9B has been proposed as a lead pin in which a strength of bonding to the electrode pad 12 can be increased as compared with the lead pin 5 of the flat pin type and misalignment of the lead pin 6 can be prevented by preventing a void 15 from occurring in the conductive material 14 (see Patent References 1, 2). Also in the lead pin of the flat pin type, a lead pin, in which a groove is disposed in an end face of a head part and a strength of bonding of the lead pin is improved and also occurrence of a void in solder is suppressed, has been proposed (see Patent Reference 3).

[Patent Reference 1] Japanese Unexamined Patent Application Publication No. 2001-217341

[Patent Reference 2] Japanese Unexamined Patent Application Publication No. 2001-358277

[Patent Reference 3] Japanese Unexamined Patent Application Publication No. 2006-86283

As described above, in the wiring substrate with lead pins in which the head part formed in the end of the shaft part is abutted on the electrode pad of the wiring substrate and is bonded to the electrode pad, a void often occurs in the conductive material in which the head part is bonded to the electrode pad. This is probably due to the fact that a solvent contained in the conductive material vaporizes at the time of bonding and also the fact that air is sucked into the conductive material at the time of bonding. In the lead pin 6 in which an end face of the head 6a is formed in a spherical surface, a separation distance to the electrode pad 12 increases in the outer periphery side of the head 6a, so that there are advantages that the void occurring in the conductive material is made easy to be relieved to the outside and a state in which the void remains in the conductive material can be suppressed. However, in the lead pin comprising the related-art head part, action of suppressing occurrence of the void is not necessarily sufficient.

Also, the wiring substrate with lead pins is inserted into and withdrawn from a socket, so that a strength of bonding between the lead pin and the electrode pad becomes a problem. The strength of bonding between the lead pin and the electrode pad depends generally on an area of bonding between the electrode pad and the head part of the lead pin, and the bonding strength can be increased by increasing a diameter of the head part. However, in order to arrange the lead pins at a high density, a dimension of the head part is restricted, so that a lead pin capable of obtaining a necessary bonding strength without increasing a diameter of the head part is desired.

In addition, in the wiring substrate with lead pins, a step (die attachment step) of installing a semiconductor element is undergone after the lead pins are bonded to the wiring substrate, so that heat resistance of a bonding part between the lead pin and the electrode pad becomes a problem. A conductive material having necessary heat resistance assuming the die attachment step is used in the conductive material for bonding the lead pin to the electrode pad, and gold plating is given to an outer surface of the lead pin as protective plating, so that there is a problem that in a step of bonding the lead pin, gold (Au) diffuses into the conductive material 14 and thereby heat resistance of the bonding part reduces.

For example, a melting temperature of Sn (95%)-Sb (5%) solder is about 235° C. and it is assumed that gold diffuses into this solder and thereby the melting temperature decreases to about 230° C. It is generally known that the melting temperature decreases when Au diffuses into Sn and is alloyed. Also in a step of bonding the lead pin to the electrode pad, gold diffuses into the conductive material. When heat resistance of the bonding part between the lead pin and the electrode pad reduces, an obstacle may occur in a post-step of bonding a semiconductor element.

Also, when gold diffuses into the conductive material, a bonding strength of the lead pin may be reduced and in manufacture of the wiring substrate with lead pins using the lead pins of thin diameters, it is necessary to pay attention to diffusion of gold in the bonding part between the lead pin and the electrode pad from the respect in which the bonding strength of the lead pin is not deteriorated.

SUMMARY

Exemplary embodiments of the present invention provide a wiring substrate with a lead pin in which occurrence of a void in a bonding part between the lead pin and an electrode pad is suppressed and also the proportion of gold diffusing into a conductive material is suppressed and there by a reduction in heat resistance of the bonding part between the lead pin and the electrode pad is suppressed and reliability is improved, and is also to provide a lead pin suitably used in this wiring substrate with the lead pin.

Exemplary embodiments of the present invention comprise the following configurations.

That is, an exemplary embodiment of the present invention is a wiring substrate with a lead pin formed by bonding a lead pin to an electrode pad formed on a wiring substrate through a conductive material. In the lead pin, a conic protrusion part whose side surface is formed in a concave surface is formed in an end face side opposed to the electrode pad of a head part formed in one end of a shaft part.

Also, the lead pin is bonded to the electrode pad in a state in which the conductive material extends to a back surface side of the head part beyond a flange part of the head part and reaches the shaft part of the lead pin and thereby, the lead pin is surely bonded to the electrode pad.

Also, it is wherein gold plating is given to an outer surface of the lead pin and the lead pin is bonded to the electrode pad by a conductive material made of a tin-antimony alloy.

Also, a lead pin in which a top part of the conic protrusion part is formed in a flat surface or a lead pin in which a top part of the conic protrusion part is formed in an R surface is suitably used as the lead pin. Here, the R surface means a rounded surface.

Also, a lead pin used in manufacture of a wiring substrate with a lead pin comprises a shaft part, and a head part formed in a diameter larger than that of the shaft part in one end of the shaft part, and is wherein an end face side to be bonded to an electrode pad formed on the wiring substrate of the head part is formed in a conic protrusion part whose side surface is formed in a concave surface.

Also, a lead pin in which a top part of the conic protrusion part is formed in a flat surface or a lead pin in which a top part of the conic protrusion part is formed in an R surface is suitably used as the lead pin.

According to a wiring substrate with a lead pin and a lead pin according to the invention, by forming a conic protrusion part whose side surface is formed in a concave surface in a head part of the lead pin, a bonding area in a bonding part between the lead pin and an electrode pad formed on the wiring substrate is ensured and a void is made easy to be relieved from a gap between the head part and a surface of the electrode pad and a situation in which the void remains in a conductive material can be suppressed and reliability of bonding between the lead pin and the electrode pad can be improved. Also, the amount of filling of the conductive material with which the gap between the head part and the electrode pad is filled can be ensured, so that a ratio of gold which diffuses into the conductive material from the lead pin can be decreased as compared with a related-art lead pin and thereby, reliability of the bonding part can be improved.

Other features and advantages maybe apparent from the following detailed description, the accompanying drawings and the claims.

DETAILED DESCRIPTION

Figure 1:
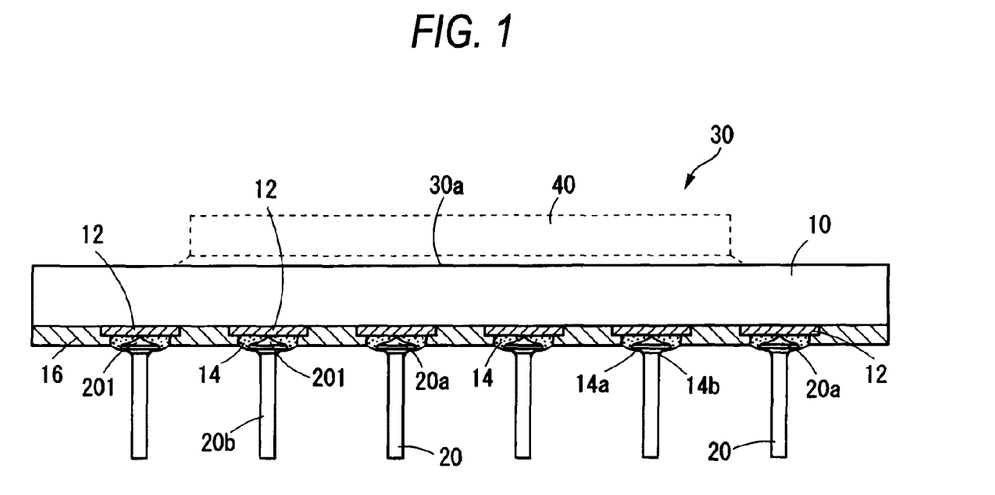
FIG. 1 is a sectional view showing a configuration of a wiring substrate with lead pins according to the invention.

FIG. 1 is a sectional view showing a configuration of one embodiment of a wiring substrate with lead pins according to the invention. A wiring substrate 30 with lead pins of the present embodiment is formed by disposing an installation part 30a for installing a semiconductor element 40 on one surface of a wiring substrate 10 and forming electrode pads 12 on the other surface of the wiring substrate 10 and bonding lead pins 20 to the electrode pads 12 by conductive materials 14 made of tin-antimony alloys.

A necessary wiring pattern and a pad for connection electrically connected to the semiconductor element 40 are formed in the installation part 30a. The other surface of the wiring substrate 10 is covered with a protective film 16 such as a solder resist, and the electrode pad 12 to which the lead pin 20 is bonded is exposed in a circular plane shape. The electrode pad 12 is formed by a copper layer, and nickel plating and gold plating are given to a surface of the copper layer in this order as protective plating. Also, a lead pin in which an iron material is used as a base material and gold plating is given to a surface of the material is used as the lead pin.

In the case of bonding the lead pin 20 to the electrode pad 12, a conductive paste made of a tin-antimony alloy is first applied to an exposed surface of the electrode pad 12 as a conductive material and a head part 20a of the lead pin 20 is aligned with each of the electrode pads 12 and the lead pin 20 is bonded by a reflow step. Concretely, the lead pin 20 is set in a support jig in which a set hole for setting the lead pin 20 is formed in arrangement matching with plane arrangement of the electrode pad 12 formed on the wiring substrate 10 and the lead pin 20 is bonded by passing through a reflow apparatus in a state of aligning the support jig with the wiring substrate 10. The wiring substrate 30 with lead pins shown in FIG. 1 is obtained by removing the support jig after the lead pins 20 are bonded to the electrode pads.

The support jig has action of having support so as to solder the lead pins 20 in a state of erecting the lead pins 20 on a substrate surface of the wiring substrate 10 while aligning the lead pins 20 with the electrode pads 12. The set hole of the lead pin 20 disposed in the support jig is formed in a diameter dimension in which the head part 20a is locked in the case of inserting a shaft part 20b of the lead pin 20.

Figure 2A:
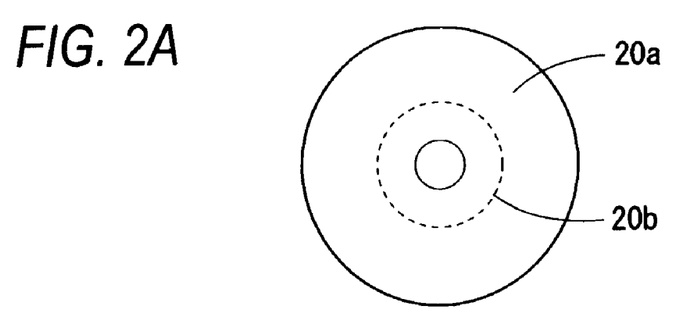
FIG. 2A is a plan view and FIG. 2B is a front view of a lead pin according to the invention.
Figure 2B:
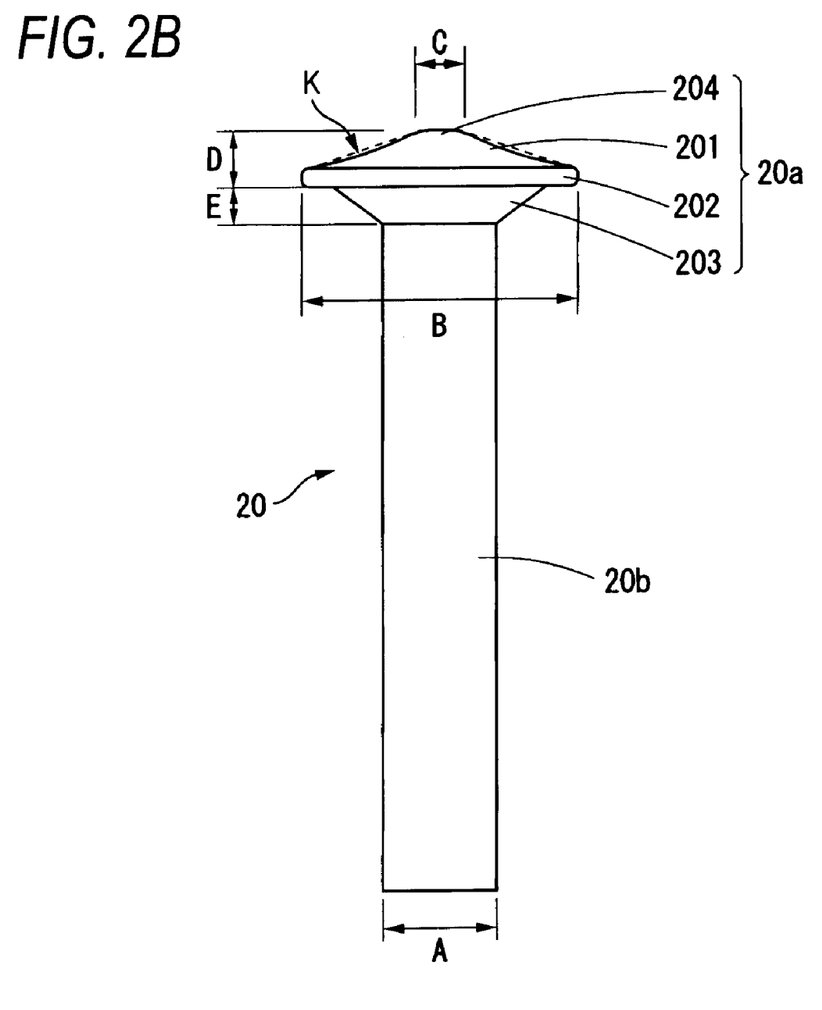

FIG. 2 enlarges and shows a configuration of the lead pin 20 used in the wiring substrate 30 with lead pins shown in FIG. 1. FIG. 2A is a plan view and FIG. 2B is a front view of the lead pin 20. As shown in FIG. 2B, in the lead pin 20, the head part 20a with a diameter larger than that of the shaft part 20b is formed integrally with the shaft part 20b in one end of the shaft part 20b. In the head part 20a, an end face side bonded to the electrode pad is formed in a conic protrusion part 201 whose top part is formed in a flat surface 204 and the side joined to the shaft part 20b sandwiching a flange part 202 is formed as a taper part 203.

The reason why the top part of the conic protrusion part 201 is formed as the flat surface 204 is because an area of bonding to the electrode pad 12 in the case of abutting the lead pin 20 on the electrode pad 12 and bonding the lead pin 20 is ensured. In a joint part between the taper part 203 and the flange part 202, an outside diameter of the taper part 203 is formed in a diameter somewhat smaller than an outside diameter of the flange part 202. The reason why the taper part 203 is formed in a back surface side of the head part 20a is because a conductive material is constructed so as to extend to an outer surface of the flange part 202 and an outer peripheral surface of the shaft part 20b beyond the flange part 202 in the case of bonding the lead pin 20 to the electrode pad 12 along with reinforcing action of the conic protrusion part 201 and the flange part 202.

In the lead pin 20, the conic protrusion part 201 of the head part 20a is formed in a conic protrusion part whose side surface is formed in a concave surface. The conic protrusion part whose side surface is formed in the concave surface means that a side surface (outer peripheral surface) of a conic body is formed in a concave curve when viewed from a sectional direction. In the embodiment, a curvature radius K of the side surface (sectional circular arc) of the conic protrusion part 201 is set at 1.5 mm.

In a manufacturing step of the lead pin 20, while forward feeding a continuous needle-shaped body formed in the same diameter as an outside diameter of the shaft part 20b, the head part 20a is formed by performing crushing processing in the cut end of the needle-shaped body using a metal mold. In order to form an end face of the head part 20a in the conic protrusion part whose side surface is formed in the concave surface, crushing processing could be performed by a processing metal mold (punch) conforming to a side surface shape of the head part 20a. The lead pin 20 comprising the conic protrusion part 201 with a predetermined concave surface shape can be mass-produced by repeating cut operations and crushing processing while forward feeding the needle-shaped body.

A shape and a dimension of the lead pin 20 can be designed properly. In the lead pin 20 shown in FIG. 2B, a diameter A of the shaft part is 0.3 mm and an outside diameter B of the flange part is 0.73 mm and a diameter C of the flat surface of the top part of the conic protrusion part is 0.15 mm and a height D of the flange part is 0.13 mm and a height E of the taper part is 0.1 mm. Also, a curvature radius in a position of the boundary between a flat part and an edge line of the conic protrusion part is 0.1 mm.

After the crushing processing is performed, gold plating is given to the outer surface and the lead pin is provided.

Figure 3:
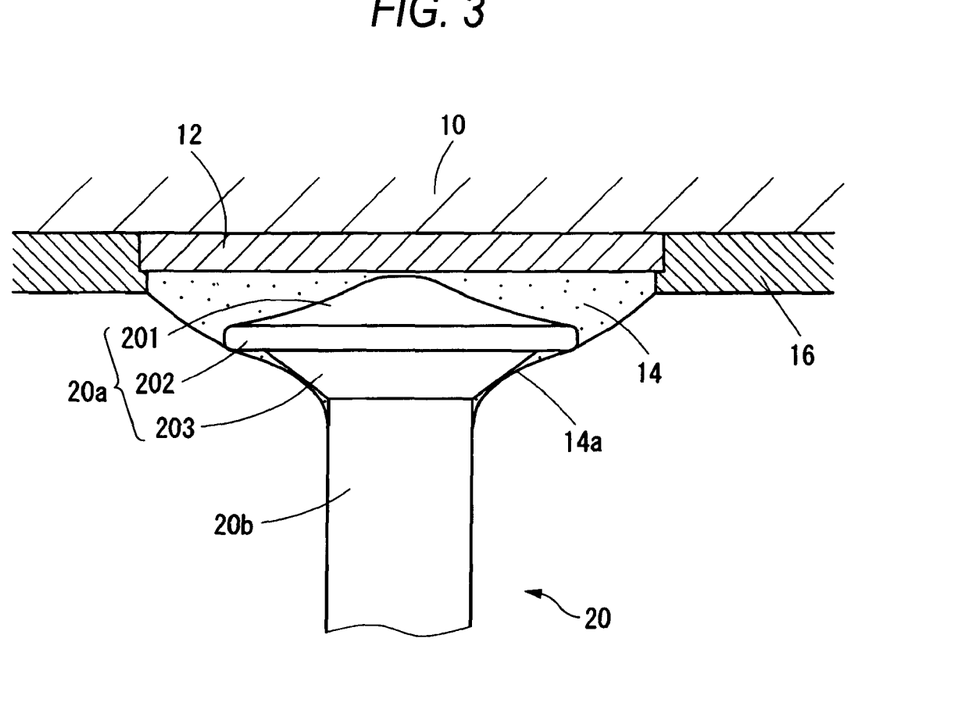
FIG. 3 is an enlarged sectional view showing a state of bonding a lead pin to an electrode pad.

FIG. 3 is an enlarged sectional view showing a state of bonding the lead pin 20 to the electrode pad 12. The head part 20a is opposed to the electrode pad 12 and the lead pin 20 is bonded by the conductive material 14. A gap between a surface of the electrode pad 12 and the head part 20a of the lead pin 20 is filled with the conductive material 14 and further, the conductive material 14 extends to an outer surface of the taper part 203 beyond the flange part 202 and reaches a basal position of the shaft part 20b. In the embodiment, tin-antimony alloy solder is used as the conductive material 14.

Since the conic protrusion part 201 is formed in the head part 20a of the lead pin 20 in the wiring substrate 30 with lead pins of the embodiment as shown in FIG. 3, a separation distance between the conic protrusion part 201 and a surface of the electrode pad 12 increases gradually from the center of the head part 20a toward the outside, so that it becomes easy to relieve a void occurring in a position sandwiched between the head part 20a and the electrode pad 12 to the outside and a situation in which the void remains between the head part 20a and the electrode pad 12 is suppressed. When the head part 20a is formed in the conic protrusion shape, as compared with a spherical pin, the separation distance between the head part and the electrode pad becomes larger from the vicinity of the center and action of emitting the void develops more effectively.

Also, when the conic protrusion part 201 whose side surface is formed in the concave surface is formed in the head part 20a as described in the embodiment, the amount of the conductive material 14 with which the gap between an end face of the head part 20a and the surface of the electrode pad 12 is filled can be increased as compared with a spherical pin or a flat pin. Therefore, a ratio at which gold by gold plating given to the outer surface of the lead pin 20 diffuses into the conductive material 14 can be decreased as compared with the spherical pin or the flat pin.

Figure 4A:
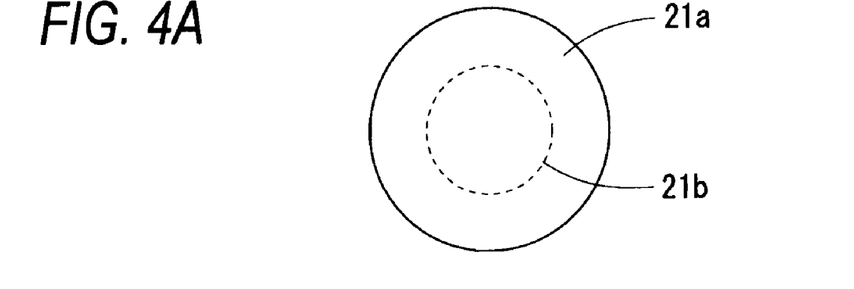
FIG. 4A is a plan view and FIG. 4B is a front view showing another configuration of a lead pin according to the invention.
Figure 4B:
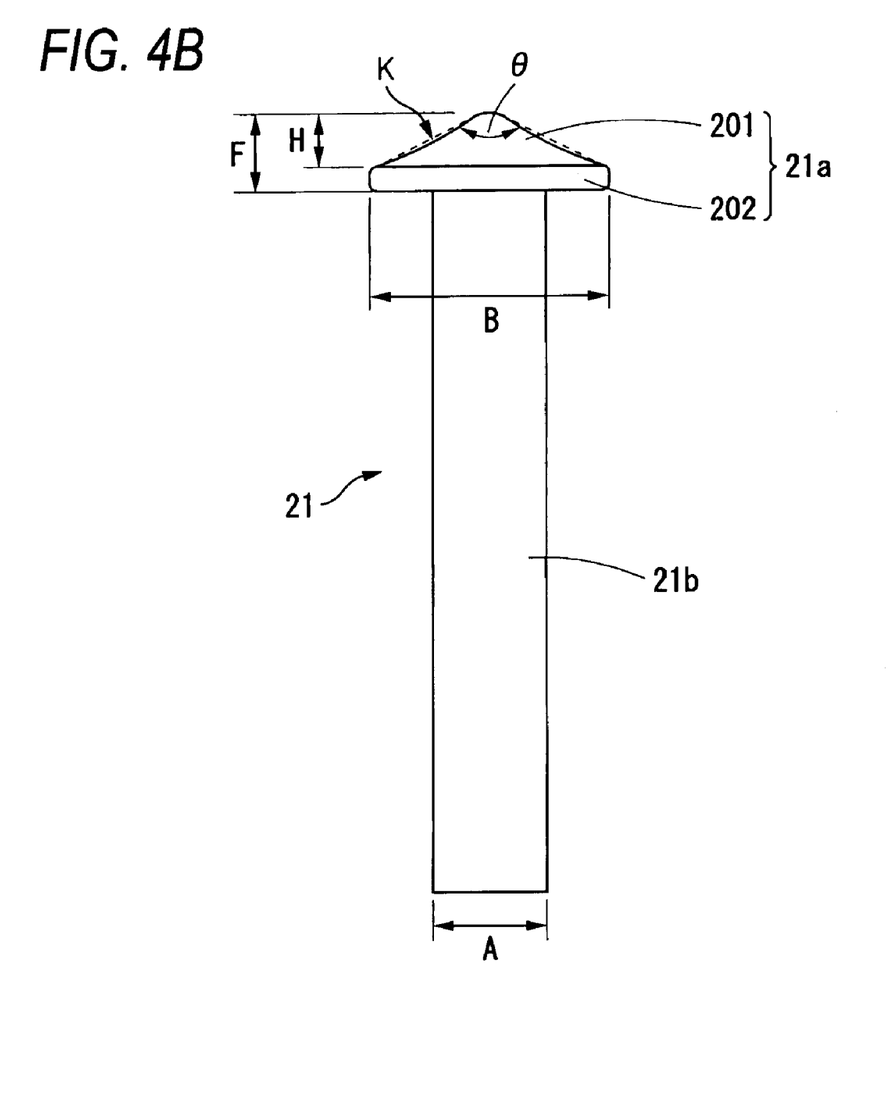

FIGS. 4A and 4B show another embodiment of a lead pin in which a conic protrusion part whose side surface is formed in a concave surface is formed in a head part 21a. A lead pin 21 of the present embodiment differs from the lead pin 20 shown in FIG. 2 in that a flat surface is not formed in a top part of a conic protrusion part 201 and the top part of the conic protrusion part 201 is formed in an R surface and a shaft part 21b is directly joined to a flange part 202 and a taper part 203 is not disposed.

In the lead pin 21 shown in FIG. 4B, a diameter A of the shaft part is 0.3 mm and an outside diameter B of the flange part is 0.6 mm and a height H of the conic protrusion part is 0.13 mm and a height F to the flange part is 0.19 mm. Also, a curvature radius R of the concave surface of the conic protrusion part is 1.5 mm and a curvature radius of the R surface of the top part of the conic protrusion part is 0.1 mm and a vertex angle θ of the conic protrusion part is 130°. Gold plating is given to an outer surface of the lead pin 21.

Figure 5:
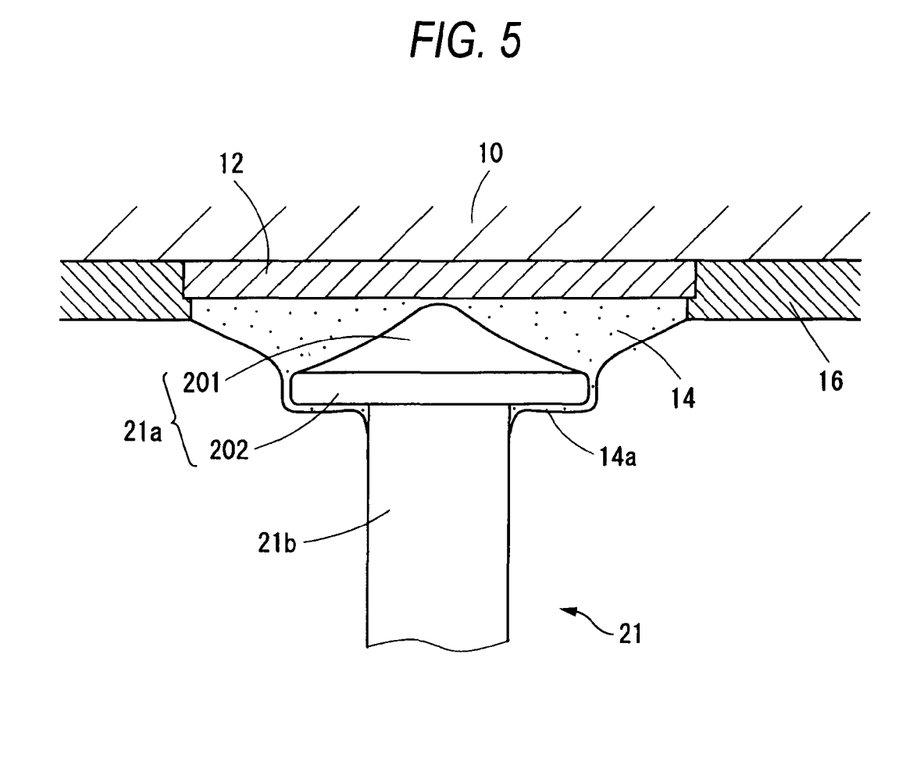
FIG. 5 is an enlarged sectional view showing a state of bonding the lead pin shown in FIG. 4B to an electrode pad.

FIG. 5 enlarges and shows a state of bonding the lead pin 21 to an electrode pad 12. A top part of a head part 21a abuts on a surface of the electrode pad 12, and a gap between the head part 21a and the electrode pad 12 is filled with a conductive material 14, and the conductive material 14 adheres to the flange part 202 of the head part 21a in a meniscus shape and also extends to a flat surface part of the head part 21a beyond the flange part 202 and reaches a basal part of the shaft part 21b.

Also in the case of the lead pin 21 of the embodiment, by disposing the conic protrusion part 201 whose side surface is formed in the concave surface in the head part 21a, avoid occurring in the conductive material 14 with which the gap between the head part 21a and the electrode pad 12 is filled can be made easy to be relieved to the outside and a situation in which the void remains in the conductive material 14 can be suppressed.

Also, by forming the side surface of the conic protrusion part 201 in a concave surface shape, the amount of the conductive material 14 with which the gap between the head part 21a and the electrode pad 12 is filled can be increased as compared with a spherical pin or a flat pin, and a ratio of gold which diffuses into the conductive material 14 from the lead pin 21 can be decreased. By suppressing the diffusion (ratio)

of gold into the conductive material 14, heat resistance of a bonding part can be prevented from deteriorating and reliability of the wiring substrate with lead pins can be improved.

Figure 6A:
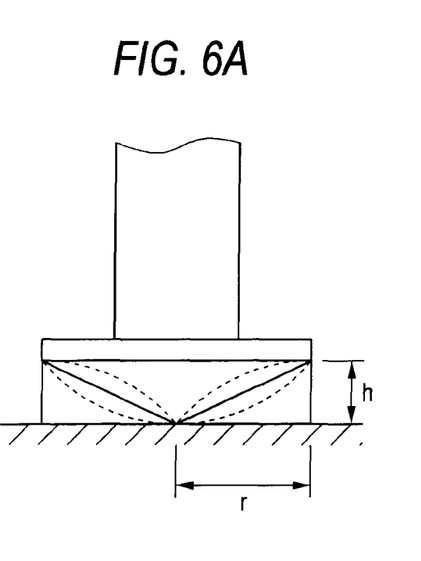
FIGS. 6A and 6B are explanatory diagrams showing a configuration used in calculation of the amount of filling of a conductive material of the portion sandwiched between an electrode pad and a head part of a lead pin.
Figure 6B:
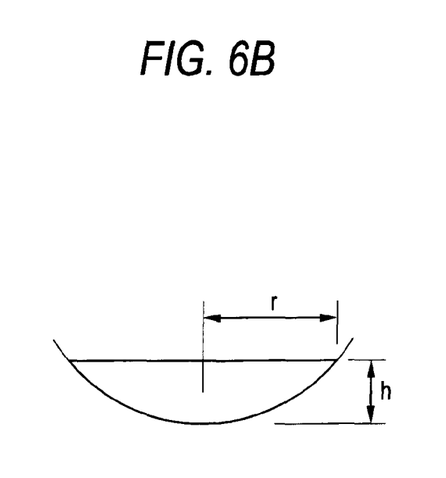

In order to estimate the extent of diffusion of gold into a conductive material, the amounts of the conductive materials with which a gap between a head part and a surface of an electrode pad is filled were compared and calculated in a lead pin according to the invention and another lead pin. Table 1 shows results of calculating the amounts of the conductive materials with which the gap between the head part of the lead pin and the surface of the electrode pad is filled in a spherical pin, a conic pin, conic pins with concave surface shapes (lead pins according to the invention). In the calculation results of Table 1, capacity of the portion sandwiched between a plane surface of the electrode pad and the head part is used as the amount of filling of the conductive material as shown in FIG. 6A. The results calculated in the case of setting a radius r of the head part at 0.30 mm and 0.40 mm and setting a height h of the head part at 0.13 mm and 0.15 mm are shown. The amount of filling for the spherical pin is obtained by subtracting volume of a spherical crown shown in FIG. 6B from volume of a columnar part made of the height h of the head part. The volume of the spherical crown is $V=\pi h(3r \times r + h \times h)/6$.

The lead pin whose top part has an R shape in the lead pins comprising conic protrusion parts with concave surface shapes according to the invention was obtained as a conic protrusion. Also, in the lead pin comprising a conic protrusion part whose top part is formed in a flat surface, volume of a region in which the flat surface is formed was subtracted from the total amount of filling and was used as the amount of filling.

TABLE 1

| Pin shape | Radius: r (mm) | Height: h (mm) | Filling amount: (mm3) | Comparison with spherical shape |
|---|---|---|---|---|
| Spherical shape | 0.30 | 0.13 | 0.01730 | 100% |
|  | 0.30 | 0.15 | 0.01953 | 100% |
|  | 0.40 | 0.13 | 0.03165 | 100% |
|  | 0.40 | 0.15 | 0.03608 | 100% |
| Conic shape | 0.30 | 0.13 | 0.02425 | 140% |
|  | 0.30 | 0.15 | 0.02799 | 161% |
|  | 0.40 | 0.13 | 0.04312 | 136% |
|  | 0.40 | 0.15 | 0.04976 | 137% |
| Concave surface conic shape (top part of R surface) | 0.30 | 0.13 | 0.03121 | 180% |
|  | 0.30 | 0.15 | 0.03645 | 186% |
|  | 0.40 | 0.13 | 0.05459 | 172% |
|  | 0.40 | 0.15 | 0.06343 | 175% |
| Concave surface conic shape (top part of flat surface) | 0.30 | 0.13 | 0.03063 | 177% |
|  | 0.30 | 0.15 | 0.03587 | 183% |
|  | 0.40 | 0.13 | 0.05402 | 170% |
|  | 0.40 | 0.15 | 0.06286 | 174% |

Table 1 shows what ratios of the filling amounts of the conductive materials for the conic pin and the conic pins with concave surface shapes to that for the spherical pin are obtained with reference to the filling amount of the conductive material for the spherical pin. The calculation results of Table 1 show that the filling amount of the conductive material greatly increases in the conic pin as compared with the spherical pin and the filling amount of the conductive material remarkably increases particularly in the case of the conic pins with concave surface shapes and the amount of increase becomes large in the case of the head part with a small diameter.

As shown in FIGS. 3 and 5, the electrode pad is formed in a diameter considerably larger than that of the head part of the lead pin when a size of the electrode pad is compared with the head part of the lead pin. Therefore, not only the gap between the head part and the electrode pad is filled with the conductive material but also the periphery of the head part is filled with a considerable amount of the conductive material. Thus, the amount of the conductive material used in bonding of the lead pin is not limited to the portion sandwiched between the head part and the electrode pad but as shown in Table 1, the amount of filling the gap between the head part and the electrode pad is remarkable in the conic pins with concave surface shapes, and action of decreasing a diffusion ratio of gold which diffuses into the conductive material by using the conic pins with concave surface shapes is probably effective sufficiently.

In addition, in Table 1, a curvature radius of the concave surface of the side surface of the conic protrusion part is made equal to a curvature radius of the spherical pin and calculation is performed, but a curvature of the concave surface formed in the conic protrusion part can be selected properly and the radius can also be increased (the curvature is decreased) than the curvature radius of the spherical pin. Even in that case, a considerable increase in the filling amount of the conductive material can be expected.

Table 2 shows results of bonding lead pins whose head parts have a spherical shape, a conic shape, a concave surface conic shape (top part of R surface) and a concave surface conic shape (top part of flat surface) to a wiring substrate and measuring respective drawing strengths, height variations and center misalignments. In all the lead pins, a radius r of the head part is set at 0.3 mm and a height h is set at 0.15 mm. A curvature of a concave surface of a conic protrusion part of the lead pin with the concave surface conic shape is 1.5 mm. The drawing strength and the center misalignment amount are an average value of 30 samples and the height variation shows a variation range.

TABLE 2

| Pin shape | Drawing strength | Height variation | Center misalignment |
|---|---|---|---|
| Spherical shape | 2.5 kg | −0.03~+0.03 mm | 0.06 mm |
| Conic shape | 2.4 Kg | −0.03~+0.03 mm | 0.06 mm |
| Concave surface conic shape (top part of R surface) | 2.8 Kg | −0.02~+0.02 mm | 0.05 mm |
| Concave surface conic shape (top part of flat surface) | 2.8 Kg | −0.02~+0.02 mm | 0.05 mm |

The measurement results of Table 2 indicate that in both cases of the lead pins in which the head parts have the concave surface conic shapes and the top parts have an R shape and a flat surface shape, the drawing strengths improve and the height variations and the center misalignment amounts are suppressed as compared with the lead pins whose head parts have the spherical shape and the conic shape. An increase in the drawing strength indicates that a bonding strength of the lead pin improves. Situations in which the height variation is suppressed and the center misalignment amount is suppressed are probably caused by suppressing the amount of a void remaining between the head part and the electrode pad.

Figure 7A:
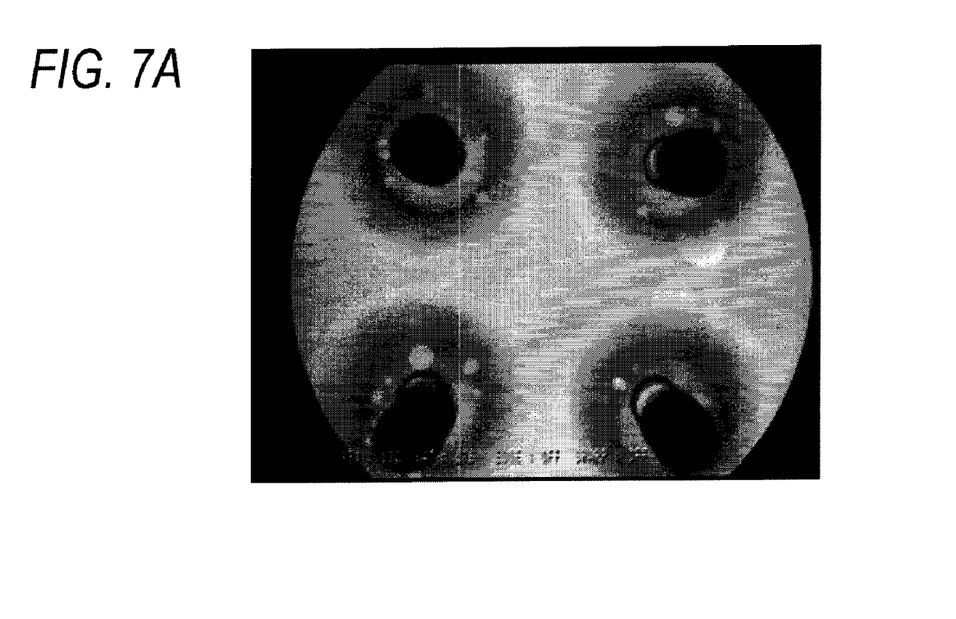
FIG. 7A is an X-ray photograph of a bonding part between a wiring substrate and lead pins with a spherical shape.
Figure 7B:
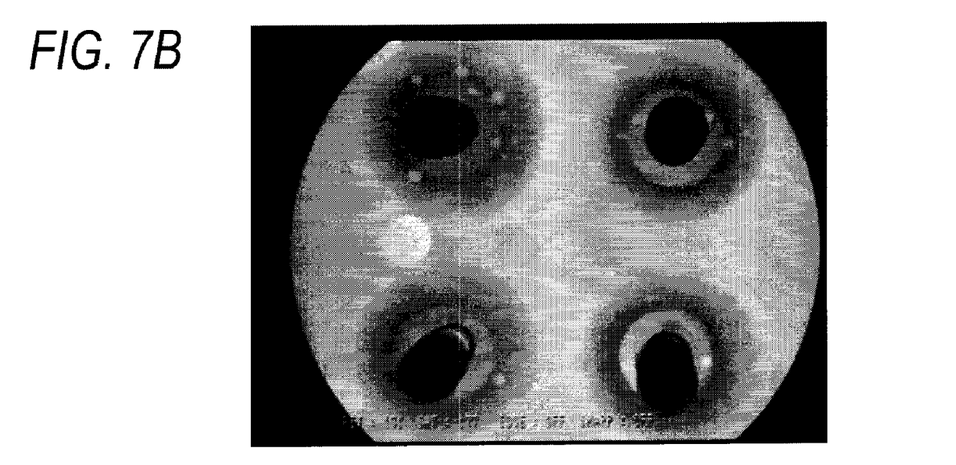
FIG. 7B is an X-ray photograph of a bonding part between a wiring substrate and lead pins with a conic shape.

FIGS. 7A, 7B and 8A, 8B show X-ray photographs of a bonding part between an electrode pad and a head part of a lead pin. FIG. 7A shows a bonding part of a lead pin with a spherical shape and FIG. 7B shows a bonding part of a lead pin with a conic shape. The black circle portions of the photographs are shaft parts of the lead pins. The portion photographing circularly around the shaft part is the head part. Small circular points see inside a circular region of the head part. These points are voids remaining between the head part and the electrode pad.

Figure 8A:
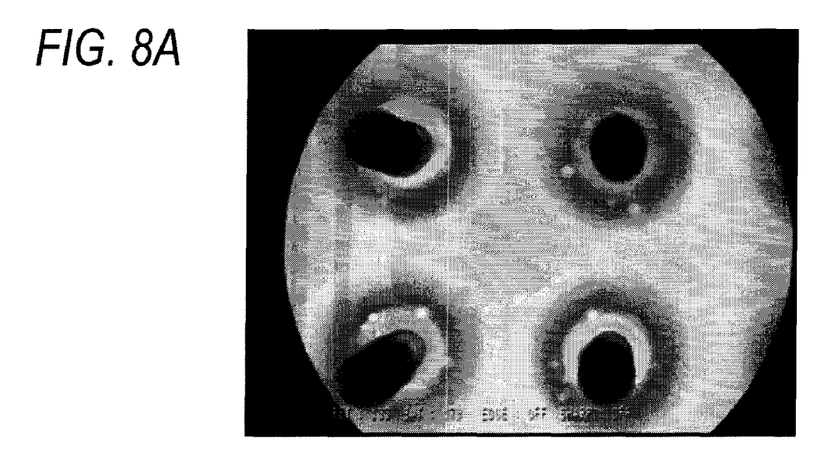
FIG. 8A is an X-ray photograph of a bonding part between a wiring substrate and lead pins with a concave surface conic shape: top part of R surface.
Figure 8B:
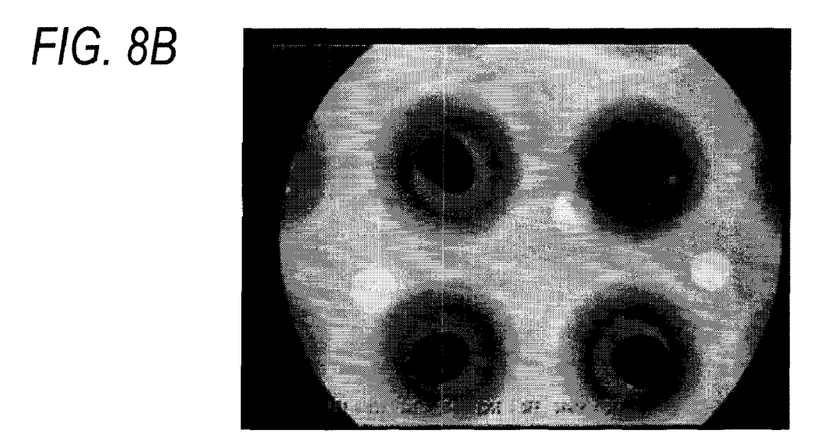
FIG. 8B is an X-ray photograph of a bonding part between a wiring substrate and lead pins with a concave surface conic shape: top part of a flat surface.

FIG. 8A shows a bonding part of a lead pin with a concave surface conic shape (top part of R surface) and FIG. 8B shows a bonding part of a lead pin with a concave surface conic shape (top part of a flat surface). A head part photographs around a shaft part and several voids see in a region of the head part.

In the case of comparing the X-ray photographs of FIGS. 7A, 7B and 8A, 8B, the voids remaining in the region of the head part in FIGS. 8A,8B clearly decrease as compared with those in FIGS. 7A, 7B. This measurement result proves that in the case of the lead pins whose head parts have the concave surface conic shapes, the amount of voids remaining between the head part and the electrode pad can be suppressed as compared with the lead pins whose head parts have the spherical shape and the conic shape.

In the recent wiring substrate with lead pins, a diameter of the lead pin tends to become smaller and in the case of the lead pin with the small diameter, an area of bonding between the electrode pad and the lead pin is greatly suppressed, so that means constructed so as to increase a bonding strength by increasing the area of bonding between the lead pin and the electrode pad by disposing the conic protrusion part with the concave surface shape in the head part as described in the lead pin of the invention is effective. Since a diameter of the head part of the lead pin becomes small and also a diameter of the electrode pad becomes smaller, means constructed so that a bonding strength can be ensured by ensuring the amount of the conductive material contributing to bonding in that case is effective.

Then, means constructed so that the amount of the conductive material used in bonding of the lead pin is ensured and a diffusion ratio of gold into the conductive material is decreased and heat resistance of a bonding part can be maintained is extremely effective in improving reliability of the wiring substrate with lead pins.

In addition, in the embodiment described above, the example of using the tin-antimony alloy solder as the conductive material has been described. A melting temperature of such tin-based solder (solder using tin as a main component) is higher than that of lead-based solder and a problem that the melting temperature of a bonding part reduces due to diffusion of gold into the conductive material arises bigger. The invention can be effectively used in a wiring substrate with lead pins using the solder (conductive material) used at such a relatively high temperature.

What is claimed is:

1. A wiring substrate with a lead pin, comprising:
a wiring substrate; and
a lead pin bonded to an electrode pad formed on the wiring substrate through a conductive material,
wherein the lead pin includes a shaft part and a head part formed in one end of the shaft part, the head part having a conic protrusion part formed in an end face side of the head part opposed to the electrode pad, the conic protrusion part being a conic body having a side surface formed as a concave curve when viewed from a sectional direction, said concave curved side surface of the conic body forming a side surface of the head part of the lead pin, said sectional direction is a section cut at a surface parallel to an axis including an apex of the conic body.

2. A wiring substrate with a lead pin as claimed in claim 1, wherein the head part has a flange part, and the lead pin is bonded to the electrode pad in a state in which the conductive material extends to a back surface side of the head part beyond the flange part of the head part and reaches the shaft part of the lead pin.

3. A wiring substrate with a lead pin as claimed in claim 1, wherein gold plating is given to an outer surface of the lead pin and the conductive material is made of a tin-antimony alloy.

4. A wiring substrate with a lead pin as claimed in claim 1, wherein a top part of the conic protrusion part is formed in a flat surface.

5. A wiring substrate with a lead pin as claimed in claim 1, wherein a top part of the conic protrusion part is formed in an R surface.

6. A lead pin used for a wiring substrate, comprising:
a shaft part; and
a head part formed in a diameter larger than that of the shaft part in one end of said shaft part,
wherein the head part has a conic protrusion part formed in an end face side of the head part to be bonded to an electrode pad formed on the wiring substrate, the conic protrusion part being a conic body having a side surface formed as a concave curve when viewed from a sectional direction, said concave curved side surface of the conic body forming a side surface of the head part of the lead pin, said sectional direction is a section cut at a surface parallel to an axis including an apex of the conic body.

7. A lead pin as claimed in claim 6, wherein a top part of the conic protrusion part is formed in a flat surface.

8. A lead pin as claimed in claim 6, wherein a top part of the conic protrusion part is formed in an R surface.

9. A wiring substrate with a lead pin as claimed in claim 1, wherein the head part further includes a taper part connected to and extending outwardly from the shaft part, and a flange part provided between the taper part and the conic protrusion.

10. A lead pin as claimed in claim 6, wherein the head part further includes a taper part connected to and extending outwardly from the shaft part, and a flange part provided between the taper part and the conic protrusion.

* * * * *